United States Patent [19]

Sakaguchi

[11] Patent Number: 5,168,217

[45] Date of Patent: Dec. 1, 1992

[54] METHOD OF DETECTING FLOATED LEAD OF ELECTRICAL COMPONENT

[75] Inventor: Hiroyuki Sakaguchi, Fukuoka, Japan

[73] Assignee: Matsushita Electric Industrial Co., Ltd., Osaka, Japan

[21] Appl. No.: 696,388

[22] Filed: May 6, 1991

[30] Foreign Application Priority Data

May 10, 1990 [JP] Japan ................... 2-120222

[51] Int. Cl.⁵ .............................. G06K 9/00
[52] U.S. Cl. ................ 324/158 R; 358/101; 358/106; 358/107; 382/8
[58] Field of Search ............. 324/158 R, 158 T, 23.1, 324/501, 533; 358/101, 106, 107; 356/394, 375, 400; 364/550, 559; 382/8

[56] References Cited

U.S. PATENT DOCUMENTS

| | | | |
|---|---|---|---|
| 3,814,845 | 6/1974 | Hurlbrink, III | 358/101 |
| 4,405,233 | 9/1983 | Grau | 324/501 |
| 4,472,056 | 9/1984 | Nakagawa et al. | 358/107 |
| 4,696,047 | 9/1987 | Christian et al. | 358/106 |
| 4,737,845 | 4/1988 | Susnki et al. | 358/101 |
| 4,794,262 | 12/1988 | Sato et al. | 358/107 |
| 4,799,268 | 1/1989 | McLean et al. | 358/101 |
| 4,800,335 | 1/1989 | Davila et al. | 324/537 |
| 4,806,776 | 2/1989 | Kley | 358/107 |
| 5,047,714 | 9/1991 | Maeno | 324/158 F |

Primary Examiner—Ernest F. Karlsen
Assistant Examiner—William J. Burns
Attorney, Agent, or Firm—Lowe, Price, LeBlanc & Becker

[57] ABSTRACT

The present invention provides a method of detecting a floated lead of an electrical component which involves the steps of positioning an electrical component above a laser device on the way of feeding the electrical component to a substrate by sucking the electrical component to a nozzle of a pick and place head; radiating a laser light from a laser device toward the leads of the electrical component thereby to detect the heights of three points of the leads; and then calculating a virtual plane including the three points of the leads to obtain a height difference of the respective leads with respect to the virtual plane.

2 Claims, 3 Drawing Sheets

METHOD OF DETECTING FLOATED LEAD OF ELECTRICAL COMPONENT

BACKGROUND OF THE INVENTION

1. Field of the Invention

This invention relates to a method of detecting a floated lead of an electrical component and, more particularly, to means for detecting a floated lead of an electrical component by radiating a laser light from a laser device toward the leads of the electrical component, calculating a virtual plane including the leads, and obtaining a height difference of the leads with respect to the virtual plane.

2. Description of the Prior Art

When a lead is floated in a case where an electrical component having a plurality of leads such as a QFP is placed on a substrate, the lead cannot be bonded to the electrode of the substrate. For this reason, heretofore, as shown in FIG. 5, there has been known means for radiating a laser light from a laser device 103 toward the leads 102 of an electrical component 101 sucked to a nozzle 100 and obtaining heights $Z1$, $Z2$,... of the leads 102 from a reference surface S to detect the float of the lead 102.

There are as causes of the floating of the lead of an electrical component, in addition to bending, deforming of a lead, an inclination error $\Delta\theta 1$ of axial center of a nozzle, an inclination error $\Delta\theta 2$ of the lower surface of a nozzle for sucking an electrical component, an inclination error of the upper surface of a mold of an electrical component, a positional error of a XY table for moving a pick and place head in X-Y directions, etc. If there is such a mechanical error or a constant error, the electrical component 101 is inclined just $\Delta\theta$ with respect to a horizontal plane L to cause an error $\Delta Z$ therebetween. Therefore, there is a problem of erroneously judging the floating of the lead 102.

SUMMARY OF THE INVENTION

Accordingly, an object of this invention is to provide a method of accurately detecting a floated lead of an electrical component by eliminating the above-described error.

In order to achieve this and other objects according to the present invention, there is provided a method of detecting a floated lead of an electrical component comprising the steps of positioning the electrical component above a laser device on the way of feeding the electrical component to a substrate by sucking the electrical component to a nozzle of a pick and place head; radiating a laser light from the laser device toward the leads of the electrical component thereby to detect the heights of three points of the leads; and then calculating a virtual plane including the three points of the leads to obtain a height difference of the respective leads with respect to the virtual plane.

With the arrangement described above, the method obtains the virtual plane including the leads and obtains a height difference of the respective leads with respect to the virtual plane. Therefore, the above-described error can be eliminated to accurately detect the floated lead of the electrical component.

These and other objects and features of the present invention will become apparent from the following detailed description in conjunction with the attached drawings.

DESCRIPTION OF THE PREFERRED EMBODIMENT

An embodiment of the present invention will now be described with reference to the accompanying drawings.

Figure 3:
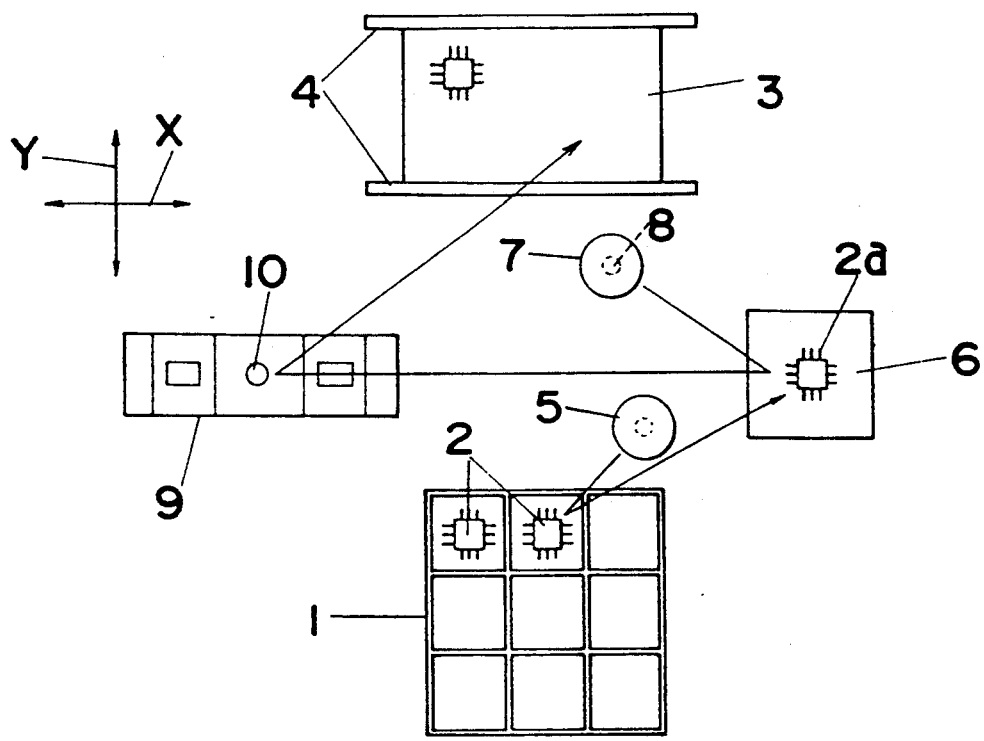
FIG. 3 is a plan view of an electrical component placing apparatus for executing a method of detecting a floated lead of an electrical component according to an embodiment of the present invention.

FIG. 3 is a plan view of an electrical component placing apparatus for executing a method of detecting a floated lead of an electrical component according to the embodiment of the present invention. The apparatus has a tray 1 as a supplying unit for supplying an electrical component 2, and a substrate 3 positioned at clamping means 4. This apparatus picks and places the electrical component 2 of the tray 1 on a table 6 by a sub pick and place head 5, recognizes and roughly corrects the positional deviation of the electrical component 2 on the table 6, and then sucks to pick up the electrical component to a nozzle 8 of a pick and place head 7. Then, the apparatus feeds the electrical component 2 above a laser device 9, radiates a laser light toward the leads 2a of the electrical component 2 while moving the pick and place head 7 in X-Y directions, and detects the positional deviations of the leads 2a in X-Y-$\theta$ directions. Thereafter, the apparatus corrects the stroke of the pick and place head 7 in the X-Y directions, and/or rotates the nozzle 8 at $\theta$ with the axial center as a center thereby to correct the detected positional deviations in the X-Y-$\theta$ directions, and then pick and place the electrical component 2 on the substrate 3.

Figure 1:
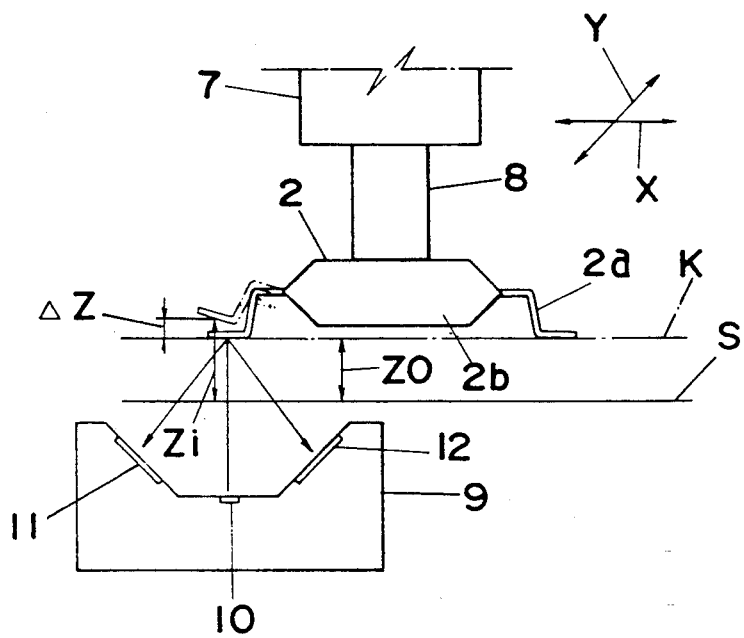
FIG. 1 is a side view of an arrangement for measuring a positional deviation of a lead in a predetermined direction according to the present invention.
Figure 2:
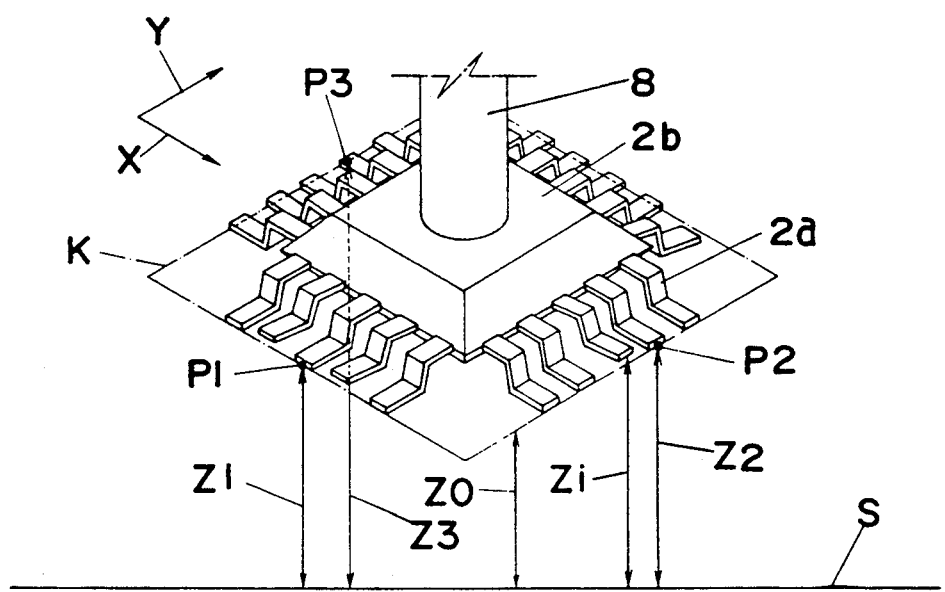
FIG. 2 is a perspective view of the arrangement in FIG. 1.

FIGS. 1 and 2 show the means for detecting the positional deviations of the lead 2a in the X-Y-$\theta$ directions and measuring the floating of the lead 2a (an error in a Z direction). The means has a mold 2b, and a number of leads 2a are extended radially from the mold 2b in four directions. The laser device 9 has photodetectors 11 and 12 at both sides of a light emitting unit 10 to raise measuring accuracy by averaging the measured values of both the photodetectors 11 and 12. The leads 2a are formed by punching a lead-frame or a film carrier.

The electrical component 2 is disposed above the laser device 9, which radiates a laser light to the leads 2a while horizontally moving the pick and place head 7 in the X-Y directions, and photodetects the reflected lights of the laser light from the leads 2a to the photodetectors 11 and 12 thereby to detect a height $Zi$ from the reference surface S of the leads 2a.

Then, three leads 2a are suitably selected, and the height $Z0$ of a virtual plane K including the reflected points P1, P2 and P3 of the three leads 2a are calculated from the heights $Z1$, $Z2$ and $Z3$ of the reflected points P1, P2 and P3 of the three leads 2a. The height $Z0$ of the virtual plane K can be simply calculated from the following plane equation:

$$aX + bY + cZ + 1 = 0$$

Then, the height difference $\Delta Z$ between the height $Zi$ of each lead $2a$ detected in advance as described above and the height $Z0$ of the virtual plane K is obtained by the following equation:

$$\Delta Z = Zi - Z0$$

Thus, the floating of each lead 2 is detected.

Figure 4:
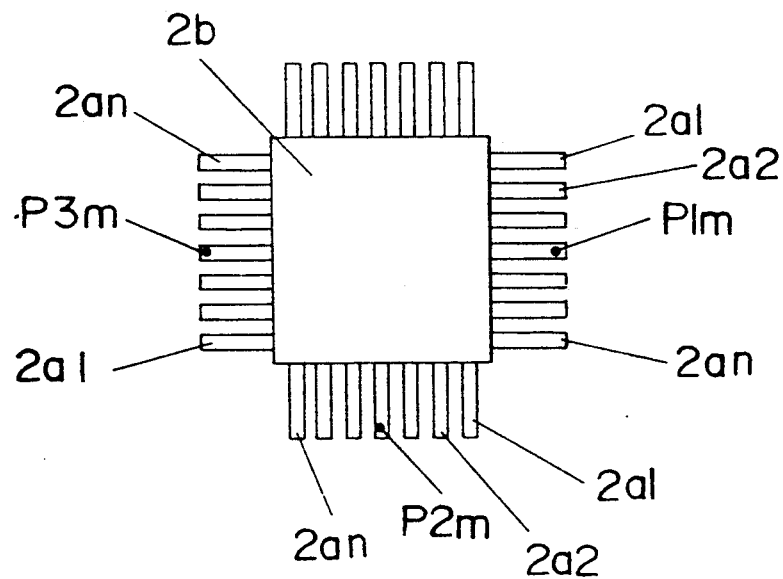
FIG. 4 is a plan view of another embodiment of the invention.
Figure 5:
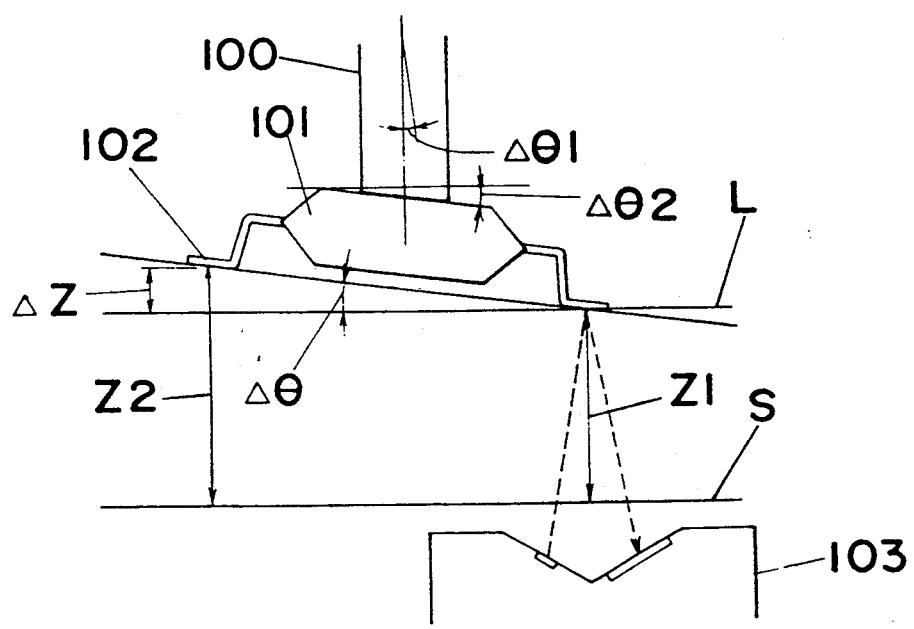
FIG. 5 is a side view of conventional means for detecting a floated lead of an electrical component.

Since the above-described method obtains the height $Z0$ of the virtual plane K including the three leads $2a$ and obtains the height difference $\Delta Z$ of each lead $2a$ with respect to thee height $Z0$ of the virtual plane K as described above, it can accurately detect the floating of the lead $2a$ by eliminating the above-described error. Virtual plane determining means may be variously considered. For example, as shown in FIG. 4, average values P1m, P2m and P3m of the heights of a plurality of leads $2a1$ to $2an$ projected from the three sides of a mold $2b$ are calculated, and a plane including these three average values P1m, P2m and P3m may be employed as a virtual plane. If a height difference $\Delta Z$ more than an allowable value is detected at the lead $2a$ of the electrical component 2, the placing of the electrical component 2 on the substrate 3 is ceased.

As described above, the present invention provides the method of detecting a floated lead of an electrical component comprising the steps of positioning the electrical component above a laser device on the way of feeding the electrical component to a substrate by sucking the electrical component to a nozzle of a pick and place head; radiating a laser light from the laser device toward the leads of the electrical component thereby to detect the heights of three points of the leads; and then calculating a virtual plane including the three points of the leads to obtain a height difference of the respective leads with respect to the virtual plane. Therefore, the method of the invention can accurately obtain the floated lead of the electrical component.

What is claimed is:

1. A method of detecting a floated lead of an electrical component comprising the steps of:

positioning the electrical component above a laser device on the way of feeding the electrical component to a substrate by sucking the electrical component to a nozzle of a pick and place head;

radiating a laser light from the laser device toward the leads of the electrical component thereby to detect the heights of three points of the leads; and then calculating a virtual plane including the three points of the leads to obtain a height difference of the respective leads with respect to the virtual plane.

2. A method of detecting a floated lead of an electrical component according to claim 1, further comprising the steps of:

calculating average values of heights of a plurality of leads projected from three sides of a mold; and calculating said virtual plane on the basis of the three average values.

* * * * *